US007958426B2

(12) United States Patent
Betts

(10) Patent No.: US 7,958,426 B2
(45) Date of Patent: Jun. 7, 2011

(54) DISTRIBUTED BLOCK CODING (DBC)

(75) Inventor: William Betts, St. Petersburg, FL (US)

(73) Assignee: Innovation Specialists, LLC, St. Petersburg, FL (US)

( * ) Notice: Subject to any disclaimer, the term of this patent is extended or adjusted under 35 U.S.C. 154(b) by 1321 days.

(21) Appl. No.: 11/510,171

(22) Filed: Aug. 25, 2006

(65) Prior Publication Data

US 2008/0065971 A1    Mar. 13, 2008

(51) Int. Cl.
    *H03M 13/00*    (2006.01)
(52) U.S. Cl. .......................... 714/755; 714/806; 714/792
(58) Field of Classification Search .................. 714/755, 714/806, 786, 784, 792, 752, 774; 375/262
    See application file for complete search history.

(56) References Cited

U.S. PATENT DOCUMENTS

| | | | |
|---|---|---|---|
| 4,677,624 A | 6/1987 | Betts et al. | |
| 4,677,625 A | 6/1987 | Betts et al. | |
| 4,677,626 A | 6/1987 | Betts et al. | |
| 5,243,627 A | 9/1993 | Betts et al. | |
| 5,602,382 A | 2/1997 | Ulvr et al. | |
| 5,771,246 A | 6/1998 | Weng | |
| 5,860,119 A * | 1/1999 | Dockser | 711/156 |
| 6,031,874 A * | 2/2000 | Chennakeshu et al. | 375/262 |
| 6,199,190 B1 * | 3/2001 | Wan | 714/786 |
| 6,567,938 B2 * | 5/2003 | Wan | 714/701 |
| 6,668,023 B1 | 12/2003 | Betts | |
| 6,715,124 B1 | 3/2004 | Betts | |
| 6,748,080 B2 * | 6/2004 | Russ et al. | 380/239 |
| 6,823,002 B1 | 11/2004 | Betts | |
| 6,986,092 B2 * | 1/2006 | Butler et al. | 714/752 |
| 7,013,421 B2 | 3/2006 | Betts | |
| 7,054,377 B1 | 5/2006 | Betts | |
| 7,055,088 B2 | 5/2006 | Betts | |
| 7,088,781 B2 | 8/2006 | Betts | |
| 7,099,401 B2 | 8/2006 | Betts | |
| 7,194,048 B2 | 3/2007 | Betts | |
| 7,203,886 B2 * | 4/2007 | Brown et al. | 714/758 |
| 7,260,764 B2 * | 8/2007 | Chen | 714/774 |

OTHER PUBLICATIONS

R. D. Gitlin, et al., "Data Communication Principles,", 1992 Plenum Press, New York, ISBN 0-306-43777-5, pp. 167-231.
A Tutorial on Reed-Solomon Coding for Fault-Tolerance in RAID-like Systems, James S. Plank, Technical Report CS-96-332, Department of Computer Science, University of Tennes.
Reed-Solomon Solutions with Spartan-II FPGAs, Antolin Agatep, XILINX white paper, WP110 (v1.1) Feb. 10, 2000, Web page: http://www.xilinx.com/support/documentation/whi.

(Continued)

*Primary Examiner* — Fritz Alphonse
(74) *Attorney, Agent, or Firm* — Thomas, Kayden, Horstemeyer & Risley, LLP

(57) ABSTRACT

Various embodiments implement distributed block coding (DBC). DBC can be used for, among other things, distributed forward error correction (DFEC) of source data in communication systems or parity backup for error correction of source data in storage systems where the source data may be corrupted by burst errors. A distributed block encoder (DBE) encodes sequential source data symbols with a plurality of sequential block encoders to produce interleaved parity codewords. The interleaved parity codewords enable decoding of error-corrected source data symbols with a distributed block decoder (DBD) that utilizes a plurality of sequential block decoders to produce the error-corrected source data symbols. A distributed register block encoder (DRBE) and a distributed register block decoder (DRBD) can each be implemented in a single block encoder and a single block decoder, respectively, by using a distributed register arrangement.

45 Claims, 8 Drawing Sheets

OTHER PUBLICATIONS

The Quantum Computer, An Introduction by Jacob West, Apr. 28, 2000 from web page: http://www.cs.rice.edu/~taha/teaching/05F/210/news/2005_09_16.htm.

"Parity Volume Set specification 1.0 [Oct. 14, 2001]", Stefan Wehlus, et al. web page: http://sourceforge.net/docman/display_doc.php?docid=7273&group_id=30568.

* cited by examiner

Interleaver Timing Table for n=6, B=3, M=2:

| 1 | 2 | 3 | 4 5 | 6 7 | 8 | 9 10 | 11 |
|---|---|---|---|---|---|---|---|
| Packet In | Time In | Time Out | Codeword Symbols | Interleaved Symbols | Output | Distributed Codeword | Output |
| 0 | 0 | 0 | D0 C0 | D0 C0 | | D0 C0 | |
| 1 | 1 | 1 | D1 C0 | D-2 C-1 | | D1 C1 | |
| 2 | 2 | 2 | D2 C0 | D-4 C-2 | | D2 C2 | |
| 3 | | 3 | P0 C0 | P0 C0 | | D3 C0 | |
| 4 | | 4 | P1 C0 | P1 C-1 | | D4 C1 | |
| 5 | | 5 | P2 C0 | P2 C-2 | | D5 C2 | |
| 6 | 3 | 6 | D3 C1 | D3 C1 | | D6 C0 | |
| 7 | 4 | 7 | D4 C1 | D1 C0 | | D7 C1 | |
| 8 | 5 | 8 | D5 C1 | D-1 C-1 | | D8 C2 | |
| | | 9 | P0 C1 | P0 C1 | | P0 C0 | |
| | | 10 | P1 C1 | P1 C0 | | P0 C1 | |
| | | 11 | P2 C1 | P2 C-1 | | P0 C2 | |
| | 6 | 12 | D6 C2 | D6 C2 | | P1 C0 | |
| | 7 | 13 | D7 C2 | D4 C1 | | P1 C1 | |
| | 8 | 14 | D8 C2 | D2 C0 | | P1 C2 | |
| | | 15 | P0 C2 | P0 C2 | | P2 C0 | D0 |
| | | 16 | P1 C2 | P1 C1 | | P2 C1 | D1 |
| | | 17 | P2 C2 | P2 C0 | D0,D1,D2 | P2 C2 | D2, D3... D8 |
| 9 | 9 | 18 | D9 C3 | D9 C3 | | D9 C3 | |
| 10 | 10 | 19 | D10 C3 | D7 C2 | | D10 C4 | |
| 11 | 11 | 20 | D11 C3 | D5 C1 | | D11 C5 | |
| 12 | | 21 | P0 C3 | P0 C3 | | D12 C3 | |
| 13 | | 22 | P1 C3 | P1 C2 | | D13 C4 | |
| 14 | | 23 | P2 C3 | P2 C1 | D3,D4,D5 | D14 C5 | |
| 15 | 12 | 24 | D12 C4 | D12 C4 | | D15 C3 | |
| 16 | 13 | 25 | D13 C4 | D10 C3 | | D16 C4 | |
| 17 | 14 | 26 | D14 C4 | D8 C2 | | D17 C5 | |
| | | 27 | P0 C4 | P0 C4 | | P0 C3 | |
| | | 28 | P1 C4 | P1 C3 | | P0 C4 | |
| | | 29 | P2 C4 | P2 C2 | D6,D7,D8 | P0 C5 | |
| | 15 | 30 | D15 C5 | D15 C5 | | P1 C3 | |
| | 16 | 31 | D16 C5 | D13 C4 | | P1 C4 | |
| | 17 | 32 | D17 C5 | D11 C3 | | P1 C5 | |
| | | 33 | P0 C5 | P0 C5 | | P2 C3 | D9 |
| | | 34 | P1 C5 | P1 C4 | | P2 C4 | D10 |
| | | 35 | P2 C5 | P2 C3 | D9,D10,D11 | P2 C5 | D11, D12... D17 |

FIG. 3

DISTRIBUTED BLOCK CODING (DBC)

FIELD OF THE INVENTION

The present invention generally relates to coding digital data and to communication systems for digital data transmission and reception or for digital data storage and retrieval. Although not limited to this application, the present invention is useful in connection with forward error correction (FEC) of source data in communication systems or parity backup for error correction of source data in storage systems where the source data may be corrupted by burst errors.

BACKGROUND OF THE INVENTION

Error correcting codes are widely used in communications systems. A good reference book for coding in connection with communications systems is R. D. Gitlin, J. F. Hayes and S. B. Weinstein, "*Data Communication Principles*", 1992 Plenum Press, New York, ISBN 0-306-43777-5 which is incorporated herein by reference. Chapter 3 gives a good description of error correcting and detecting codes and provides references to many other good sources of information in the field. In the field of communications, source information is transmitted or stored into an imperfect medium. A receiver recovers the source information which may be corrupted by errors due to the imperfect medium. Error correcting codes have been developed that add redundancy to transmitted information, enabling correction of errors in the remote receiver.

Block codes are error correcting codes that operate on a fixed size block of digital information. Examples of block codes are Hamming codes and Bose-Chaudhuri-Hocquenghem (BCH) codes. Digital information is transmitted or stored in units or symbols which may contain single digital data bits of information or multiple digital data bits of information. Block codes combine a fixed number of source data symbols and a fixed number of redundant symbols into a coded block containing a fixed number of coded symbols. The coded block of coded symbols is referred to as a "codeword" and the redundant symbols are referred to as "parity symbols". A block encoder is a device that accepts a fixed number of source data symbols, computes redundant parity symbols relating to the source data symbols and outputs a coded block, or codeword, containing the source data symbols and redundant parity symbols.

Various coding algorithms are available or may be developed for computing the redundant parity symbols. Coding algorithms can be differentiated by the ratio of redundant symbols to source symbols, complexity of encoding, complexity of decoding, number of errors that can be corrected, type of errors that can be corrected, etc. A block decoder is a device that receives the coded block, or codeword, corrects errors in the source symbols, and outputs the corrected source symbols, while discarding the redundant parity symbols.

There is another type of error correcting code known as a "convolutional" error correcting code. The convolutional code operates on a sequence of source symbols to generate an output sequence with additional redundant information. A convolutional encoder is a sequential circuit with memory of previous symbols. Each output symbol is related to all previous symbols, unlike the block encoder, which generates coded blocks, or codewords, that are completely independent of previous blocks or codewords.

Forward error correction (FEC) systems are used in many data communication and storage systems today. These systems "forward" redundant information to the remote receiver to facilitate "error correction." Systematic codes typically transmit unmodified user source data directly in a block with appended redundant parity information at the end of the block. The encoded block of source data and parity information is commonly known as a "codeword." A decoder in the remote receiver utilizes the redundant information to correct errors that may have occurred during transmission.

FEC codes are selected for properties that benefit specific applications. Hamming codes and Bose-Chaudhuri-Hocquenghem (BCH) codes are two of many examples. The popular Reed-Solomon (RS) codes are a subclass of BCH codes. Many FEC systems implement concatenated codes, such as a RS block code concatenated with a convolutional trellis code. Block codes, such as the Hamming, BCH, and RS codes, can correct multiple errors that may occur in a block of data. Most codes are designed to correct random errors, although some codes are designed to correct burst errors that occur on sequential symbols. Burst error events may cause a large number of errors in a single block. In burst error environments, the FEC system may include an interleaved block code concatenated with a distributed trellis encoder. The FEC block codes encode k source data symbols into a fixed block or codeword of n symbols containing p redundant parity check symbols where p=n−k. RS codes can correct up to p/2 random symbol errors in a block of n symbols. A burst of errors in excess of the error correcting capacity of the code (p/2) will cause the FEC decoder to fail, resulting in errors in the decoded block. Interleaving methods are used to interleave the blocks dispersing the symbols of each encoded block over a large number of blocks. The interleaved blocks are transmitted into or stored in a communication medium susceptible to burst error events. A deinterleaver in the receiver reassembles the encoded blocks, while beneficially dispersing the burst errors among many blocks. Each block then has fewer errors that can be reliably corrected by the code.

Interleavers, such as a convolutional interleaver, are used in the art to disperse burst errors. A convolutional interleaver may pass coded symbols through B sections or branches of increasing delay. Each section has delay increasing in steps of M symbols. The first section has a delay of zero and the last section has a delay of M*(B−1) symbols. Thus, adjacent symbols from any codeword are separated by B symbol periods at the interleaver output. This convolutional interleaver can protect against error burst durations of B symbol periods. For a block or codeword size of n symbols and M*B greater than or equal to n, a burst duration less than M*B symbol periods will result in no more than M errors in the interleaved block. The deinterleaver operates in the reverse order passing the first received symbol through a delay section of M*(B−1) symbols and the next received symbols through sections having M fewer delayed symbols per section. The final received symbol is passed through a section with no delay. The total delay of combined interleaver and deinterleaver is then M*(B−1) symbol periods for all symbols.

Conventional interleaving methods have undesirable side effects. Conventional interleavers delay the data prior to transmission and scramble the original order of the source data. The reordered source symbols yield unrecognizable data at remote receivers unless they are deinterleaved. A deinterleaver is required in the receiver to reassemble the data in the correct order for decoding. The deinterleaver adds undesirable additional delay and typically must be synchronized with the remote interleaver. The codeword symbols are spread out in the channel over M*B*(B−1) symbol periods. The final decoding of the full codeword is delayed by M*B*(B−1)+n−1 symbol periods. The conventional interleavers and deinterleavers add complexity to equipment and usually require significant additional memory.

There is a need in the industry for better systems and methods for correcting burst errors. The inventor has discovered a new coding methodology that addresses, among other things, the correction of burst errors.

SUMMARY OF INVENTION

The present invention provides various embodiments for implementing distributed block coding (DBC). This new DBC can be used for, among other things, distributed forward error correction (DFEC) of source data corrupted by burst errors or distributed parity backup of source data in storage systems where the source data may be corrupted by burst errors.

One embodiment, among others, for implementing DBC is a distributed block encoder (DBE). The DBE encodes sequential source data symbols with a plurality of sequential block encoders to produce interleaved parity codewords. The interleaved parity codewords enable decoding of error-corrected source data symbols.

More specifically, each sequential data symbol is processed by a different block encoder. For a set of B block encoders, B symbols are processed and transmitted before the next symbol enters the first block encoder. In this way, each symbol of a coded block, or codeword, is separated from other symbols in the codeword by B symbol periods. This protects each codeword from error bursts of B symbol periods in duration. This method beneficially transmits the original source data with no delay and in its original temporal sequence. This also beneficially reduces memory requirements in the DBE which does not store the source data. Prior art interleaved systems must store both source data and parity information in the transmitter to facilitate interleaving.

Another embodiment, among others, for implementing DBC is a distributed block decoder (DBD). The DBD receives the source data and interleaved parity codewords from the DBE (or the DRBE described later) and decodes the source data and interleaved parity codewords with a plurality of sequential block decoders to produce sequential decoded error-corrected source data symbols. Source data can be decoded with no delay and/or error corrected with less delay than conventional interleaved systems and with lower complexity.

Another embodiment, among others, for implementing DBC is a distributed register block encoder (DRBE), which is essentially a type of DBE. The DRBE can be implemented in a single block encoder by using a distributed register arrangement. The single block encoder utilizes multiple registers that can be selected by indirect addressing with very little additional complexity.

Another embodiment, among others, for implementing DBC is a distributed register block decoder (DRBD), which is essentially a type of DBD. The DRBD can be implemented in a single block decoder by using a distributed register arrangement. The DRBD receives the source data and interleaved parity codewords from either the DBE or the DRBE. A plurality of registers residing within or associated with the single block decoder stores the source data and interleaved parity codewords, respectively. Furthermore, the source data symbols are produced by sequentially communicating the source data and interleaved parity codewords from the registers to the single block decoder. Source data can be decoded with no delay and/or error corrected with less delay than conventional interleaved systems and with lower complexity.

Another embodiment, among others, is a communication system that includes receivers with differing FEC capabilities and that is made possible by the DBE or DRBE in a transmitter. The system comprises a transmitter having a DBE or DRBE. The transmitter transmits a data stream having original source data and interleaved parity codewords to a medium on the same or separate channels. A first receiver without a DBD or DRBD can receive the data stream from the medium and can identify source data in the data stream. A second receiver with the DBD or the DRBD can receive the data stream from the medium and can identify and/or correct the source data in the data stream with the DBD or DRBD. The corrected source data will correspond more accurately to the original source data as compared to the uncorrected source data, because the corrected source data has been reconstructed from interleaved parity codewords whereas the uncorrected source data is corrupted by the medium.

Other embodiments, systems, methods, features, and/or advantages associated with the present invention will become apparent to one of skill in the art upon examination of the drawings and detailed description.

BRIEF DESCRIPTION OF THE DRAWINGS

The present invention can be better understood with reference to the following drawings. The components in the drawings are not necessarily to scale, emphasis instead being placed upon clearly illustrating the principles of the present invention. Like reference numerals designate corresponding parts throughout the several views.

FIG. 3 is a table illustrating relative interleaver timing delays associated with the prior art convolutional interleaver of FIG. 2 and the distributed block encoder (DBE) of FIG. 4.

DETAILED DESCRIPTION OF THE PREFERRED EMBODIMENT

Figure 1:
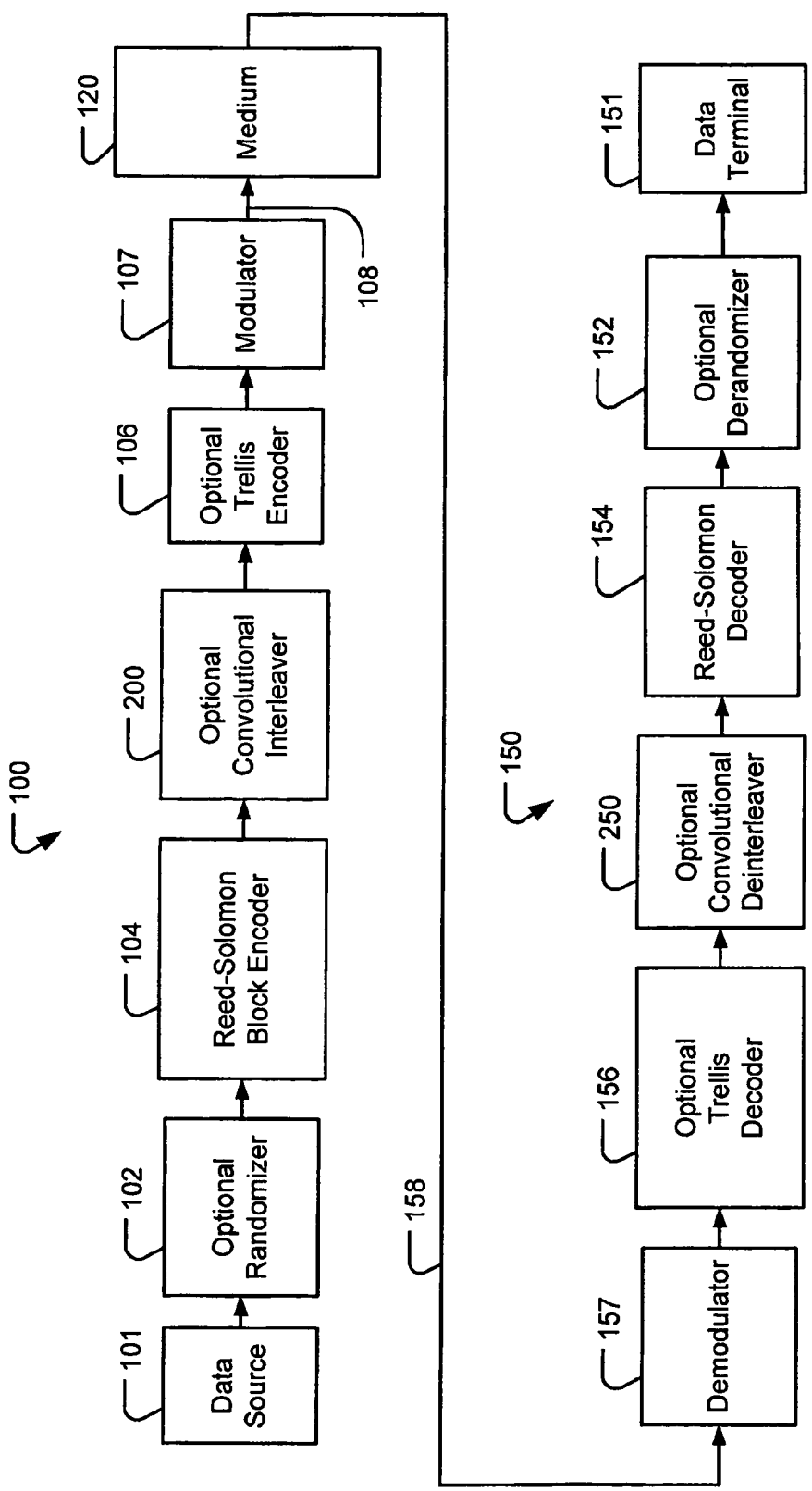
FIG. 1 is a block diagram of an example implementation of a prior art conventional interleaved coding system.

Many forward error correction (FEC) systems implement concatenated codes, such as a RS block code concatenated with a trellis code. In burst error environments, the FEC system may include an interleaved RS block code concatenated with a distributed trellis encoder, as is shown in prior art interleaved coding system of FIG. 1. FIG. 1 illustrates one example of a prior art interleaved coding system with functions that are common to most FEC systems and relevant to the new distributed block encoder (DBE). Such a system can be used for the transmission or storage of digital data.

Referring to FIG. 1, data source 101 generates digital source data into optional randomizer 102. Data is randomized in most data transmission systems to assure data transitions and avoid bias that may color the transmitted signal spectrum or disrupt automatic equipment such as adaptive equalizers. Source data from the randomizer 102 is input to the block encoder 104.

Block encoder 104 could be any type of FEC encoder, such as a Hamming, BCH, or RS encoder. A common type of block encoder implements the RS code. Block encoder 104 encodes k source data symbols into a fixed block or codeword of n symbols containing p redundant parity check symbols where p=n−k.

The codeword, or block, of n symbols is output from block encoder 104 into optional convolutional interleaver 200. Interleaver 200 can be any known interleaver. A common type of interleaver is the convolutional interleaver. The operation of optional convolutional interleaver 200 will be described later.

The output of optional interleaver 200 is coupled to an optional trellis encoder 106. Trellis encoding is a coded modulation format used in many data communications systems. Trellis encoding as used in this document may encompass other coded modulation formats, such as turbo coding.

Modulator 107 conditions the signal for transmission into the medium 120, which can be a propagation medium, where data is communicated on a signal that is propagated, or a storage medium, where data is stored. The operation of modulator 107 depends on specific applications.

The output of modulator 107 is coupled by signal path 108 into the medium 120. The medium 120 can be a propagation medium or a storage medium.

The output of medium 120 is coupled by signal path 158 into the demodulator 157. The demodulator 157 demodulates the signal from signal path 158 to recover the coded symbol stream that was transmitted by the remote FEC system 100. The demodulated symbol stream may contain single errors or bursts of multiple errors due to imperfections or disturbances in the medium 120.

The output of demodulator 157 is a recovered baseband signal that is processed by optional trellis decoder 156. Optional trellis decoder 156 may correct some errors in the recovered baseband signal. Optional trellis decoder 156 is not required for uncoded modulation formats.

The output of optional trellis decoder 156 is deinterleaved by optional deinterleaver 250 as will be described later. Burst errors from the imperfect medium will be dispersed across multiple codewords by the deinterleaver 250, resulting in fewer random errors in the deinterleaved codewords output from the deinterleaver 250. Errors in the deinterleaved codewords can be corrected by the RS decoder 154, depending upon the error correction capability of the FEC code. The decoder 154 can be any type of FEC block decoder, but must match the FEC encoder 104 in the remote transmitter. Examples of such FEC decoders include Hamming decoders or BCH decoders, such as the popular RS decoders.

The error corrected output of decoder 154 is coupled to optional derandomizer 152. Optional derandomizer 152 is required if the remote FEC system 100 utilized an optional randomizer 102. Derandomizer 152 restores the original source data that was generated by data source 101. The restored error corrected source data is coupled to the final destination data terminal 151.

Prior Art Convolutional Interleaver

Figure 2:
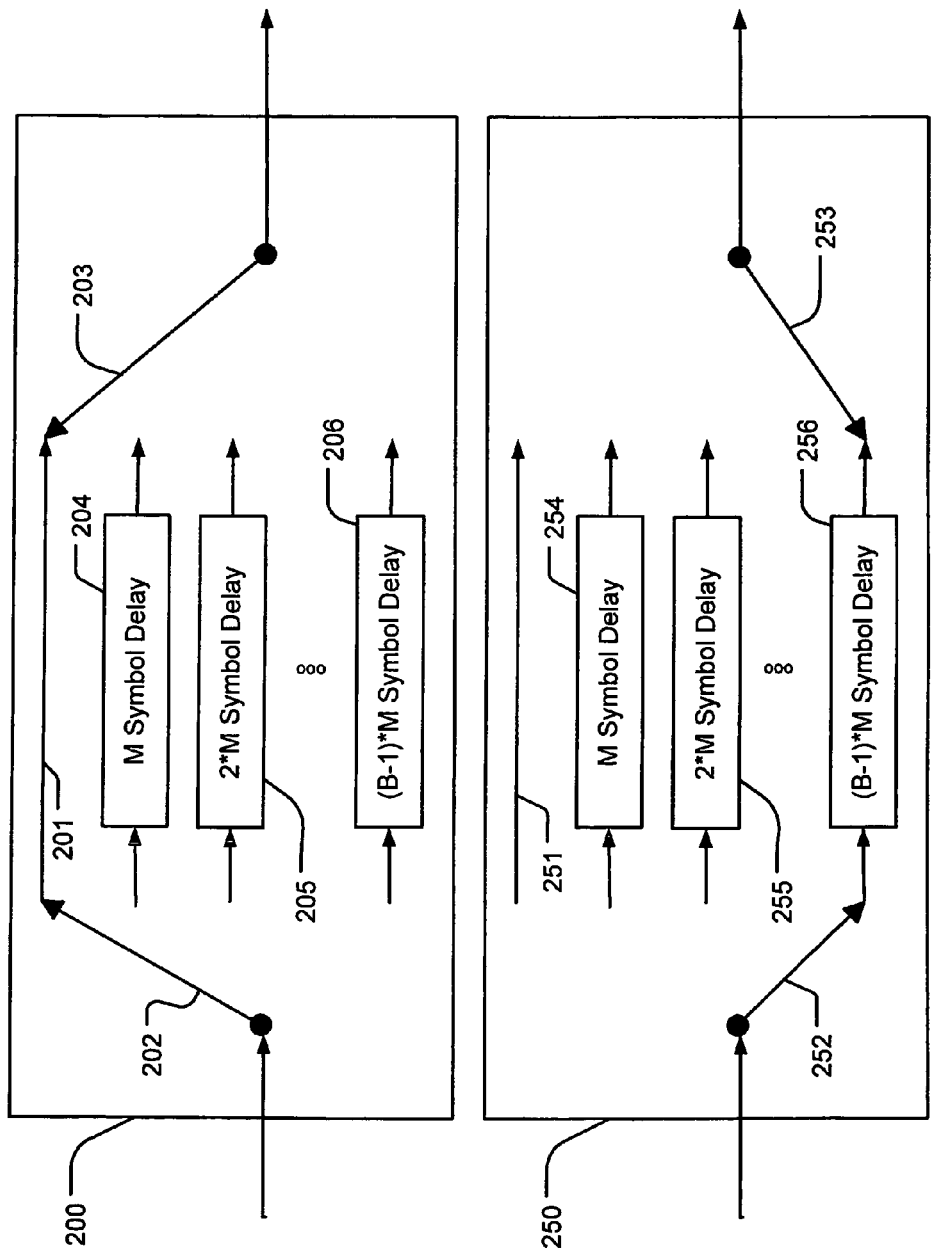
FIG. 2 is a block diagram of a prior art convolutional interleaver of FIG. 1.

Interleavers, such as the prior art convolutional interleaver shown in FIG. 2, are used to disperse burst errors. The convolutional interleaver 200 passes coded symbols through B sections of increasing delay. Switch 202 passes the symbols to each section and switch 203 extracts a delayed symbol from the same section for output. Each section has delay increasing in steps of M symbols. The first section 201 has a delay of zero and the last section 206 has a delay of (B−1)*M symbols. Switch 202 and switch 203 pass one symbol through each of the B sections then repeat the process for the next B symbols. Thus, adjacent symbols from any codeword are separated by B symbol periods at the interleaver output. This convolutional interleaver can protect against error burst durations of B symbol periods. For a block or codeword size of n symbols and M*B greater than or equal to n, a burst duration less than M*B symbol periods will result in no more than M errors in the interleaved block.

The deinterleaver 250 operates in the reverse order. Switch 252 passes the received symbols to each section and switch 253 extracts a delayed symbol from the same section for output. Switch 252 passes the first received symbol through section 256 for a delay of (B−1)*M symbols and the next received symbols through sections having M fewer delayed symbols per section. The final received symbol is passed through section 251 with no delay. Switch 252 and switch 253 pass one symbol through each of the B sections, then repeat the process for the next B symbols. The total delay of combined interleaver and deinterleaver is then M*B*(B−1) symbol periods for all symbols.

Interleaver Symbol Timing

FIG. 3 is a timing table illustrating undesirable effects of the convolutional interleaver of FIG. 2, such as the additional delay and the reordering of the source data. The codeword symbols are spread out in the channel over M*B*(B−1)+n−1 symbol periods. The final decoding of the full codeword is delayed by M*B*(B−1)+n−1 symbol periods. The example in FIG. 3 uses codewords of n=6 coded symbols, B=3 interleaver sections, M=2 delay steps and p=3 parity symbols. Column 1 illustrates the input of packets of data symbols. Columns 2 and 3 illustrate the time sequence of data symbols coming in and coded symbols going out. Note that there are twice as many coded output symbols as raw input source symbols due to the added redundancy of 3 parity symbols. The output data rate is increased by a factor of 2 as computed by the ratio n/(n−p).

Columns 4 and 5 illustrate the sequence of codewords generated by the prior art coding system. Each codeword contains 3 data symbols and 3 parity symbols. Column 5 identifies the codewords sequentially as C0, C1 . . . etc. Columns 6 and 7 illustrate the output of the prior art convolutional interleaver in the transmitter. The negative indices in columns 6 and 7 identify symbols that entered the convolutional interleaver prior to the relative reference time zero used in the table. The convolutional interleaver delay elements contain memory that retains symbols of previous codewords until the final symbol of the codeword exits the interleaver as identified in column 8. Notice that symbols from codeword C0 are separated by 3 or 4 output symbol periods. Thus, any burst error of 3 symbols in duration cannot impact more than 1 symbol of the codeword. However, the sequence of source data is dispersed significantly with source symbols D0 and D1 in column 6 separated by 7 symbol periods. The reordered source symbols yield unrecognizable data at remote receivers unless they are deinterleaved.

Column 8 identifies when the decoded symbols arrive at the output of the deinterleaver. Symbols cannot be decoded until all 6 symbols of each codeword are output from the deinterleaver. The $6^{th}$ symbol of codeword C0 arrives at the deinterleaver output after a delay of 17 symbol periods. The RS decoder can then recover and correct the first data symbols D0, D1 and D2. The codeword is delayed by M*B*(B−1)+ n−1 symbol periods.

Columns 9 and 10 illustrate the beneficial improvements to be realized by the new DBE. All data symbols in column 9 are output immediately in their original order: D0, D1, D2 . . . etc. There is no memory of previous codewords in the DBE. All symbols from each codeword are separated by 3 symbol periods yielding protection for all burst errors of duration 3 symbol periods or less. Beneficially the output of the first codeword C0 arrives after a delay of 15 symbol periods when the DBD can recover and correct the data symbols D0, D3 and D6 of the first codeword. Data symbol D0 can be output immediately but the remaining data symbols are buffered until all three codewords have been received. The output of the third codeword C2 arrives after a delay of 17 symbol periods. After 17 symbol periods all data symbols D0 through D8 can be recovered, corrected and output. This decoding of a complete block of distributed codewords is beneficial in packet communications and storage systems where packets of data are transmitted and may traverse the internet independently. In the prior art interleaver of column 8 the final data symbols D6, D7 and D8 of codeword C2 arrive after a longer delay of 29 symbol periods.

Distributed Block Encoder (DBE)

Figure 4:
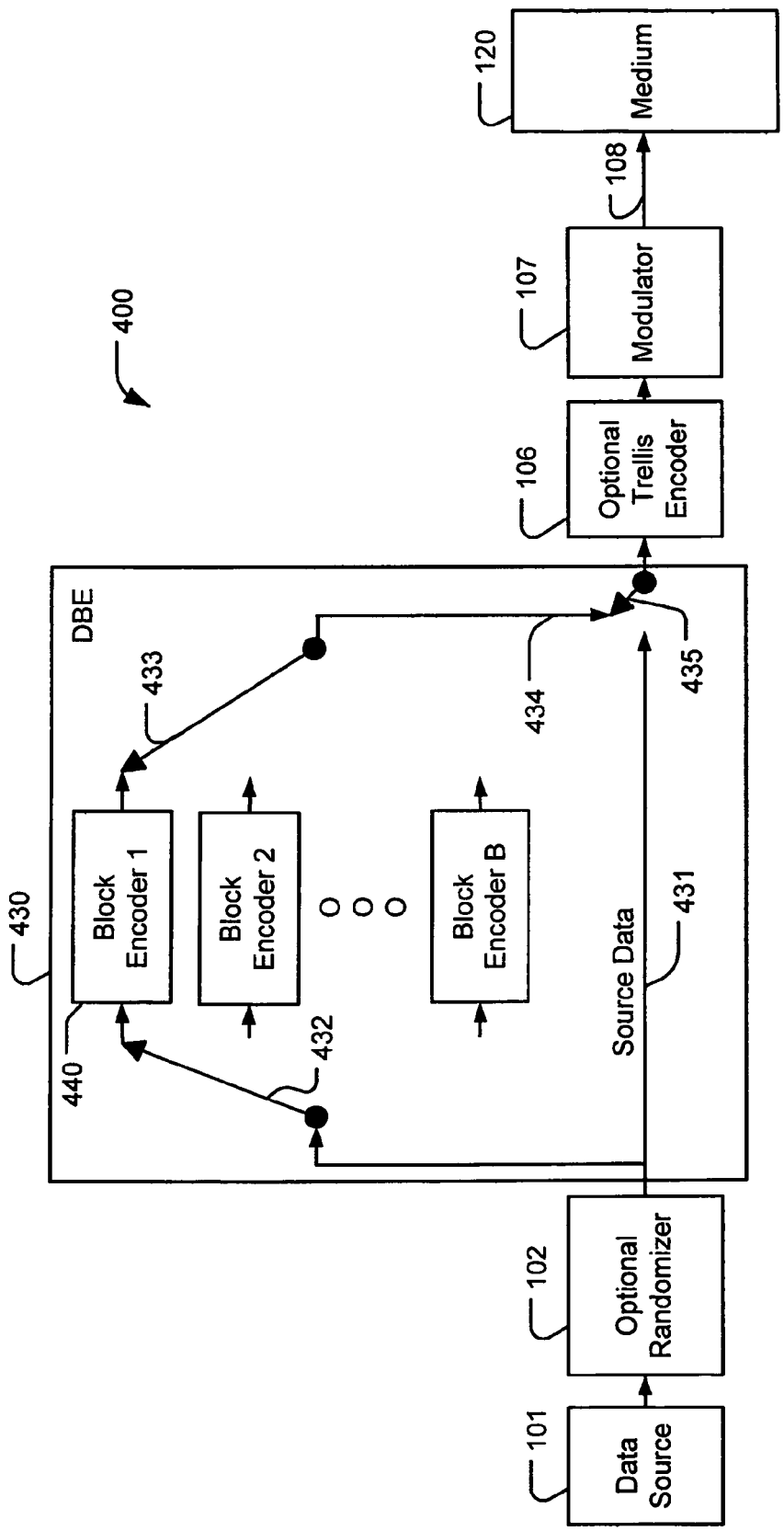
FIG. 4 is a block diagram of an example implementation of a distributed block encoder (DBE) in accordance with the present invention.

FIG. 4 is a block diagram of an example implementation of DBE 400 in accordance with the present invention. Such a system can be used in connection with the transmission or storage of digital data.

Data source 101 generates digital source data into optional randomizer 102. Data is randomized in most data transmission systems to assure data transitions and avoid bias that may color the transmitted signal spectrum or disrupt automatic equipment such as adaptive equalizers. The randomizer 102 may be an encryption device to protect the privacy of the source data. The randomizer 102 may not be required in other applications, such as data storage systems. Source data from the randomizer 102 is input to the DBE 430 for distributed FEC (DFEC) encoding as will be described later.

The output of DBE 430 is coupled to an optional trellis encoder 106. Trellis encoding is a coded modulation format used in many data communications systems. Trellis encoding as used in this document may encompass other coded modulation formats such as turbo coding. Trellis encoding may not be required in some digital data storage applications. The optional trellis encoder 106 may be a distributed trellis encoder as taught in my U.S. Pat. No. 4,677,625 titled "Distributed Trellis Encoder," which is incorporated herein by reference. The output of optional trellis encoder 106 is a baseband signal that is coupled to modulator 107.

Modulator 107 conditions the signal for transmission into the medium 120. The operation of modulator 107 depends on specific applications. For wireless broadcast applications the modulator may utilize frequency modulation, phase modulation, quadrature amplitude modulation (QAM), vestigial sideband (VSB) modulation, pulse amplitude modulation (PAM), spread spectrum modulation, orthogonal frequency division modulation (OFDM), code division multiple access (CDMA) modulation or any other modulation format. For wired applications the modulator may utilize QAM, VSB modulation, PAM, discrete multitone (DMT) modulation, or any other modulation format. For storage in magnetic media the modulator may use PAM or other common magnetic media formats. The modulator can operate in the appropriate frequency range of the medium including for example acoustic sound pressure waves, radio frequency (RF), ultra high frequency (UHF), microwave, and optical frequencies.

The output of modulator 107 is coupled by signal path 108 into the medium 120. Signal path 108 may be a wire(s) for wired applications, a radio frequency antenna for wireless applications, a fiber optic cable or lens for optical applications, a mechanical transducer for acoustic applications, a write device such as a magnetic head for magnetic storage applications, etc. The medium 120 may be free space for wireless applications and may contain additional equipment, such as repeaters, satellite relay, switching centers, internet routers, etc. The distributed FEC (DFEC) system will protect the source data as it propagates through or is stored in the medium 120.

The DFEC is implemented in the transmitter by DBE 430. The DBE 430 couples the source data on connection 431 to switch 432 and switch 435. Switch 435 receives source data on connection 431 and operates initially to output the source data from DBE 430 directly to the optional trellis encoder 106 with no delay. This beneficially transmits the source data in its original order such that a remote receiver without a FEC system can recover the data. There is no requirement for synchronization of the source data in the remote receiver.

Source data on connection 431 is also routed to switch 432. Switch 432 distributes the source data to two or more block encoders 440. Each block encoder 440 implements a block encoding method, for example but not limited to, Hamming or Bose-Chaudhuri-Hocquenghem (BCH) encoding, The block encoders 440 can be different block encoders that perform different types of block encoding. In the preferred embodiment, the block encoders 440 are identical and implement Reed-Solomon (RS) encoding (a type of BCH encoding). The number B of block encoders 440 is dependent on the amount of interleaving that is desired. The block encoders 440 operate on source data symbols that may be single digital data bits or fields containing multiple data bits. A block encoder symbol is typically one byte or 8 bits of data. A burst error event duration of B symbol periods can be dispersed by using B block encoders. In the preferred embodiments, B is two or more. Switch 432 operates to pass the first symbol to block encoder 1 and the second symbol to block encoder 2. Switch 432 distributes one symbol to all B block encoders. After B symbols have been distributed, the switch 432 repeats the sequence passing the next B symbols to the block encoders 440.

The block encoders 440 will each encode k source data symbols into a block of n coded symbols while constructing p=n−k redundant parity symbols. In the preferred embodiments, k is one or more and n is two or more. After k*B source symbols have been encoded by DBE 430, each block encoder 440 will have constructed one interleaved parity codeword register containing p symbols. Beneficially, the DBE 430 will have already transmitted the k*B source symbols without delay. Switch 435 will then select connection 434, the output of switch 433 for transmission. Switch 433 will first transmit an interleaved parity codeword symbol from block encoder 1, then from block encoder 2. Switch 433 will transmit one interleaved parity codeword symbol from all block encoders 440. After B interleaved parity codeword symbols have been transmitted, the switch 433 repeats the sequence transmitting the next B interleaved parity codeword symbols from all block encoders 440. This process continues until all p interleaved parity codeword symbols have been transmitted from all B block encoders.

After p*B interleaved parity codeword symbols have been transmitted, the switch 435 again selects the source data on connection 431 for transmission and the block encoders 440 are reset to begin encoding the next blocks of data. The output data rate is increased by a factor of n/k over the source data rate to accommodate the FEC interleaved parity codeword symbols. While transmitting the interleaved parity codeword symbols, the source data can be gated or buffered.

In general, the prior art FEC systems generate interleaved codewords that include source symbols and parity symbols. In the example of FIG. 3, the prior art system generates a first 6 symbol codeword containing symbols D0, D1, D2, P0, P1 and P2. These symbols are then interleaved prior to transmission. In contrast, the new DBE 430 generates a first codeword containing the symbols D0, D3, D6, P0, P1 and P2. Thus, the DBE codeword source symbols are interleaved with respect to the code. In effect, as the DBE 430 alternates its output between source data symbols and interleaved parity codewords, the source symbols are transmitted in their original order and the parity symbols (encoded in the interleaved parity codewords) are interleaved with parity symbols from other codewords as shown in columns 9 and 10 of FIG. 3.

The DBE 430 has an optional mode of operation allowing the interleaved parity codewords to be transmitted in another packet or over another channel. The interleaved parity codewords on connection 434 can be routed to a second modulator for transmission. This allows remote receivers to recover the source data on the first channel without benefit of interleaved parity codewords. More capable receivers can recover the interleaved parity codewords on the second channel for error correction. The performance margin on the interleaved parity codeword channel can be different than that of the primary source data channel. Such a dual mode is a basic capability of modulation formats, such as orthogonal frequency division multiplexing (OFDM) and discrete multi-tone (DMT).

Switch 435 is not required if dual transmission paths are used. It is important to note that most block encoders 440 incorporate switching that passes the source data directly while encoding a block and subsequently passes the redundant parity symbols at the end of the block. In this configuration, switch 435 is not required because source data passes directly through each block encoder 440 to switch 433, where it can be output from DBE 430 directly to optional trellis encoder 106.

The DBE 430 offers protection against burst errors by permitting reconstruction of source data with little increase in complexity. The additional complexity includes switching logic for switch 432 and switch 433 and the additional memory of (B−1) registers for interleaved parity codewords.

Distributed Block Decoder (DBD)

Figure 5:
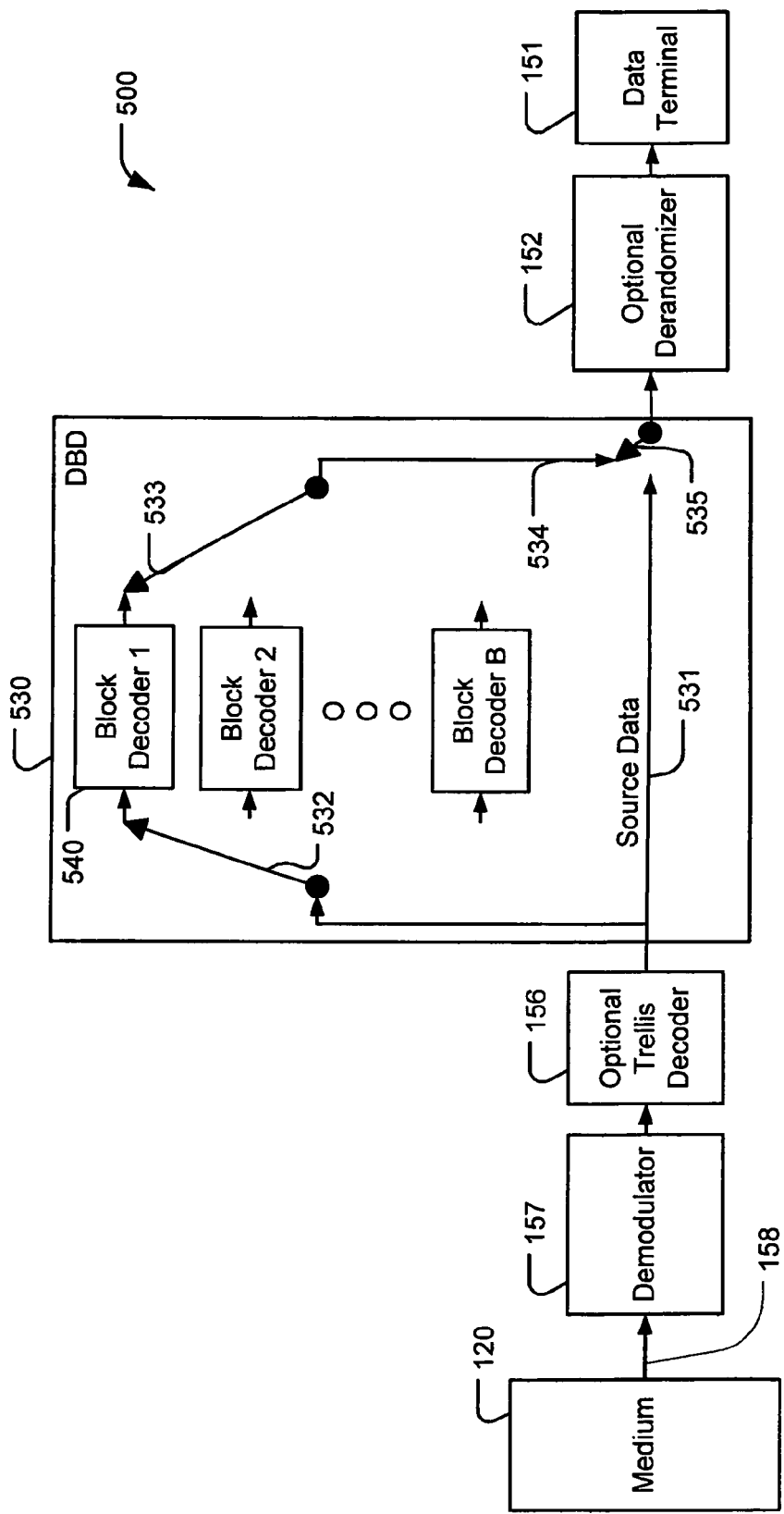
FIG. 5 is a block diagram of an example implementation of a distributed block decoder (DBD) in accordance with the present invention that can decode the interleaved parity codewords produced by the DBE of FIG. 4 (or the DRBE of FIG. 6).

FIG. 5 is a block diagram of an example implementation of a distributed block decoder (DBD) system 500. Such a system can be used for the reception or recovery of source data from the medium 120.

The output of medium 120 is coupled by signal path 158 into the demodulator 157. Signal path 158 may be a wire(s) for wired applications, a radio frequency antenna for wireless applications, a fiber optic cable or lens for optical applications, a mechanical transducer for acoustic applications, a read device, such as a magnetic head for magnetic storage applications, etc. The demodulator 157 demodulates the signal from signal path 158 to recover the coded symbol stream that was transmitted by a remote DBE 400. The demodulated symbol stream may contain single errors or bursts of multiple errors due to imperfections in the medium 120.

The output of demodulator 157 is a recovered baseband signal that is processed by optional trellis decoder 156. Optional trellis decoder 156 may correct some errors in the recovered baseband signal. The optional trellis decoder 156 may be a distributed trellis decoder as taught in my U.S. Pat. No. 4,677,625 titled "Distributed Trellis Encoder," which is incorporated herein by reference. Optional trellis decoder 156 is not required for uncoded modulation formats. The output of optional trellis decoder 156 is processed by distributed block decoder DBD 530 to correct errors, as will be described later.

The error corrected output of DBD 530 is coupled to optional derandomizer 152. Optional derandomizer 152 is required if the remote DBE 400 utilized an optional randomizer 102. If the remote DBE 400 randomizer 102 was an encryption device then the derandomizer 152 is a decryption device. Note that synchronization of a decryption device can be beneficially expedited because the source data has not been interleaved and can be used immediately without time consuming deinterleaving and error correction. Derandomizer 152 restores the original source data that was generated by data source 101. The restored error corrected source data is coupled to the final destination data terminal 151.

The DFEC is implemented in the receiver by DBD 530. The DBD 530 couples the uncorrected data on connection 531 to switch 532 and switch 535. These switches are operated to distribute the incoming uncorrected symbols. The first k*B uncorrected symbols are the original source data. The next p*B symbols are the interleaved parity codeword symbols that were generated by the remote DBE 430 to facilitate FEC. Switch 535 will be positioned to discard the interleaved parity codeword symbols and can output either the incoming uncorrected symbols from connection 531 or the corrected symbols from connection 534.

Switch 535 receives uncorrected data on connection 531 and operates initially to output the uncorrected source data from DBD 530 directly to the optional derandomizer 152 with no delay. This beneficially recovers the uncorrected source data in its original order with no delay. Certain types of data, such as but not limited to, audio, video, and image data, contain redundancy that may be sufficient to convey information even in a high error rate environment. Data fields containing synchronization, address, routing, or similar information may be preferentially accessed immediately without the benefit of error correction to accelerate synchronization and to setup initial routing instructions.

Thus, various embodiments are possible. For example, in one embodiment, the source data symbols can be processed (used in some way) and then later updated with the decoded source data symbols (e.g., updating or refreshing an image on a screen). As another example embodiment, a determination can be made in the DBD 530 as to whether the source data symbols are corrupted and then a selection can be made in the DBD 530 as to whether to replace the source data symbols that are corrupted with the decoded and error corrected source data symbols.

Recovery of error corrected data requires a significant delay in the DBD 530. Each block decoder 540 receives a complete codeword of n symbols before errors can be corrected. The n-symbol codeword contains the original k source symbols and p=n−k interleaved parity codeword symbols, any of which can be in error. After receiving the n-symbol codeword, the block decoders 540 can correct typically p/2 symbol errors in the n-symbol codeword. The output of the block decoders 540 is the original k error corrected source symbols. Block decoders 540 can be any type of FEC decoders, such as RS decoder 154, but generally match the block encoders 440 in the remote DBE 430. Although clearly not limited to this implementation, in the preferred embodiments, the block decoders 540 are all RS block decoders.

Uncorrected data on connection 531 is routed to switch 532 for error correction. Switch 532 distributes the uncorrected data to multiple block decoders 540. The number B of block decoders 540 is dependent on the amount of interleaving that is desired and matches the number of block encoders 440 in the remote DBE 430. The block decoders 540 operate on uncorrected data symbols that may be single digital data bits or fields containing multiple data bits. A block decoder symbol is typically one byte, or 8 bits, of data. A burst error event duration of B symbol periods can be dispersed by using B block decoders. Switch 532 operates to pass the first symbol to block decoder 1 and the second symbol to block decoder 2. Switch 532 distributes one symbol to all B block decoders. After B symbols have been distributed the switch 532 repeats the sequence passing the next B symbols to the block decoders. This process will repeat until n uncorrected symbols have been distributed to every block decoder 540. Note that a burst error of duration B symbols will result in only one symbol error into each block decoder 540. This significantly improves the error correction performance of the system.

The block decoders 540 will each receive a full block or codeword of n uncorrected symbols including k uncorrected source symbols and $p=n-k$ interleaved parity codeword symbols. The block decoders 540 will correct up to p/2 errors in the k source symbols using the p interleaved parity codeword symbols which are subsequently discarded. After n*B uncorrected symbols have been decoded by DBD 530 each block decoder 540 will have decoded one block of k corrected source symbols from n uncorrected symbols. Switch 535 will then select connection 534, the output of switch 533 for output. Switch 533 will first output a corrected source symbol from block decoder 1, then from block decoder 2. Switch 533 will output one corrected source symbol from all block decoders 540. After B corrected source symbols have been output the switch 533 repeats the sequence transmitting the next B corrected source symbols from all block decoders 540. This process continues until all k corrected source symbols have been transmitted from all B block decoders. A total of k*B corrected source symbols are output and the p*B interleaved parity codeword symbols are discarded.

After k*B corrected source symbols have been output, the block decoders 540 are reset to begin decoding the next blocks of data. The output data rate is decreased by a factor of k/n below the uncorrected data rate as the redundant FEC interleaved parity codeword symbols are discarded. While collecting the next block of n*B uncorrected symbols, the switch 535 can be positioned to output no symbols or to output uncorrected source symbols from connection 531.

The DBD 530 has an optional mode of operation allowing the interleaved parity codeword symbols to be received in another channel from a second demodulator. This allows remote receivers to recover the source data on the first channel without benefit of FEC. More capable receivers can recover the interleaved parity codeword symbols on the second channel for error correction. Such a dual mode is a basic capability of modulation formats, such as OFDM and DMT. Total throughput delay is beneficially reduced by utilizing multiple channels.

It is important to note that most block decoders 540 incorporate switching and buffers that pass the corrected source symbols directly out, while decoding the next block of uncorrected symbols. In this configuration, switch 535 is not required because data passes directly through each block decoder 540 to switch 533, where it can be output from DBD 530 directly to optional derandomizer 152. Uncorrected symbols are available without delay on connection 531 for use in applications that do not require error correction.

The DBD 530 offers protection against burst errors with little increase in complexity. The additional complexity includes switching logic for switch 532 and switch 533 and the additional memory of (B−1) registers to retain each n symbol uncorrected codeword. This is in contrast to a conventional interleaved block code that requires the additional deinterleaver and its memory.

ARQ System with DBD

In another embodiment, the DBD 530 (or DRBD 730 of FIG. 7) can be used in conjunction with an automatic repeat request (ARQ) system that requests retransmission of blocks that are detected to be in error. The ARQ systems typically disrupt transmission, while sending a request and while receiving a repeated block back from the remote transmitter. The DBD 530 will allow raw source data to flow rapidly with no delay for FEC. When errors are detected, then the blocks in error can be reprocessed by the block decoders 540 of the DBD 530 to correct the errors without requiring retransmission. This keeps the signal channels clear for the flow of data. In the event the block decoders 540 cannot correct the errors, then the ARQ system can be activated to request a full retransmission of a block.

Distributed Register Block Encoder (DRBE)

Figure 6:
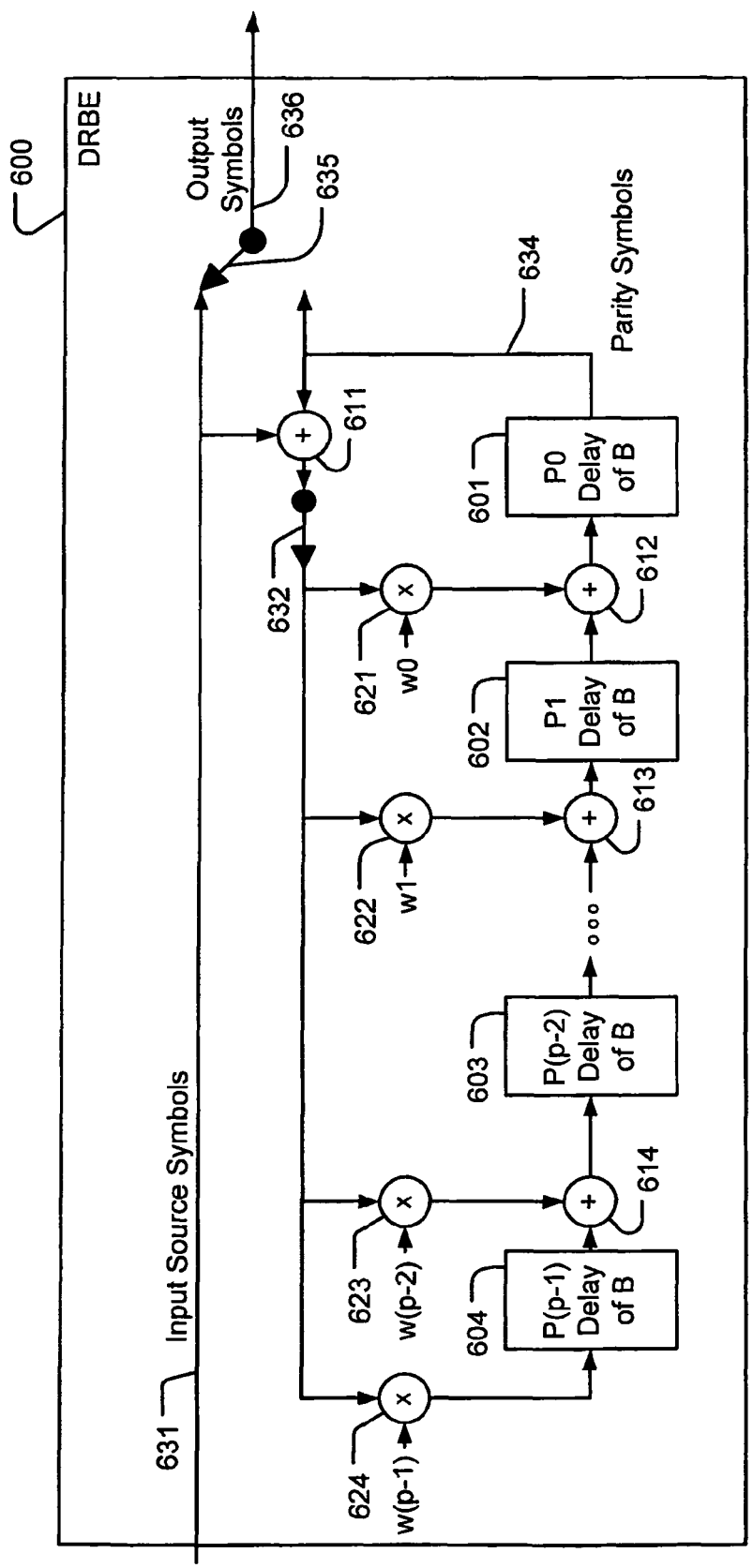
FIG. 6 is a block diagram of an example implementation of a distributed register block encoder (DRBE) in accordance with the present invention that uses registers associated with a single block encoder to implement the DBE of FIG. 4.

In another embodiment, the DBE 430 can be implemented in a single FEC block encoder by using a distributed register arrangement, as shown in FIG. 6. Referring to FIG. 6, the distributed register block encoder (DRBE) 600 utilizes multiple registers (associated with but preferably residing within the single FEC block encoder) that can be selected by indirect addressing with very little additional complexity. Indirect addressing is a common technique used in software-based systems. The DRBE 600 incorporates parity memory elements that are represented by delay elements 601, 602, 603 and 604 that store respective parity symbols P0, P1, through $P(p-2)$ and $P(p-1)$. There are p delay elements, one for each parity symbol. A conventional FEC block encoder stores one symbol in each delay element. This new DRBE encoder 600 stores B past symbols in each delay element 601, 602, 603 and 604. The delay elements can access past symbols independently, but it is only necessary to access the oldest symbols. A symbol generated B symbol periods earlier is recovered, modified in accordance with the coding algorithm, and then stored. As examples, the memory can take the form of a conventional shift register or other low complexity memory.

Source data symbols are input on connection 631. Initially, switch 635 selects these source symbols on connection 631 for immediate output on connection 636 with no delay or modification. The source symbols on connection 631 are also provided to the first addition device 611, where they are added to the parity symbol output on connection 634 from delay element 601. The output of addition device 611 is then sent through switch 632 to multiplier devices 621, 622, 623 and 624. The multiplier devices effectively select and weigh the addition result by factors w0, w1, through $w(p-2)$ and $w(p-1)$, respectively. The output of multiplier device 621 is added to the output of delay element 602 by addition element 612 and stored in delay element 601 as an updated parity symbol P0. The output of multiplier device 622 is added to the output of the next delay element, which may be delay element 603, by addition element 613 and stored in delay element 602 as an updated parity symbol P1. The output of multiplier device 623 is added to the output of delay element 604, by addition element 614 and stored in delay element 603 as an updated parity symbol P(p−2). The output of multiplier device 624 is stored in delay element 604 as an updated parity symbol P(p−1). The delay element outputs are not modified until all delay elements have been updated. While the operations have been explained sequentially, they may actually occur simultaneously in some designs.

This process is repeated once for each source symbol. After all k source data symbols have been processed, switch 635 selects the parity symbols on connection 634 for output from the delay elements. Switch 632 is opened while the parity symbols are output. The B parity symbols P0 from delay element 601 are output first. Then, the B parity symbols P1 from delay element 602 are output. All parity symbols are output from all delay elements, finishing with P(p−2) and P(p−1) from delay elements 603 and 604. The B stored parity elements can be identified by the codewords they represent as C0, C1, C2 . . . C(B−1). Then, the sequence of output parity symbols can be identified as P0C0, P0C1, P0C2 . . . P0C(B−1), P1C0, P1C1, P1C2 . . . P1C(B−1), P2C0, P2C1, P2C2 . . . P2C(B−1) . . . . Thus, the parity symbols from any codeword can be seen to be separated by B symbol periods and are effectively interleaved. These interleaved parity codewords are protected from burst errors having durations of up to B symbol periods.

The example presented here used a simple combination of addition and multiplier devices to compute parity symbols. Many other combinations and logic designs are possible in FEC systems. All parity calculation methods can be used with the DRBE 600.

A conventional FEC encoder, such as a RS encoder, can be enhanced by the use of distributed registers. The set of RS parity symbol registers is replaced by a set of multiple registers.

Example of (6,3) DRBE

For purposes of illustration, the DRBE 600 can implement a (6,3) block code. This is a simple example to illustrate the combinatorial logic of FIG. 6 for a single block encoder where B=1.

The codeword length is n=6, there are k=3 source data symbols and p=3 parity symbols. Multiplication devices have the values w2=1, w1=1 and w0=0. For this case after the first source data symbol D0 is processed then the parity symbols will store P2=D0, P1=D0 and P0=0. Then following D1 the parity symbols are updated to P2=D1, P1=D1+D0 and P0=D0. Then following D2 the parity symbols are updated to P2=D2+D0, P1=D2+D1+D0 and P0=D1+D0. Thus, each source data symbol D0, D1 and D2 is represented in at least two of the parity symbols. The parity symbols are then transmitted following the source data symbols yielding a codeword sequence of D0, D1, D2, P0, P1 and P2. This codeword provides sufficient redundancy to correct any single error that may occur in the remote received codeword.

The decoder can replicate the encoder operating on the received and possibly corrupted source data symbols D0', D1' and D2' to produce decoder parity symbols P0', P1' and P2'. If no errors have occurred then the decoder parity symbols will equal the received parity symbols. The code can correct only one error so if any one of the decoder parity symbols does not match the corresponding received parity symbol then that received parity symbol must be in error and all data symbols are assumed to be correct. If two or more parity symbols do not match then the data symbol represented in those mismatching parity symbols must be in error and can be corrected. For example:

If P2, P1 and P0 don't match P2', P1' and P0' then correct D0'

If P1 and P0 don't match P1' and P0' then correct D1'

If P2 and P1 don't match P2' and P1' then correct D2'

Note that two erasures can be corrected. Subtraction will be used in the example but the actual operations are modulo 2 exclusive-or operations. For example:

If D0 and D1 are missing then D0=P2−D2 and D1=P0−D0

If D0 and D2 are missing then D0=P0−D1 and D2=P2−D0

If D1 and D2 are missing then D1=P0−D0 and D2=P2−D0

Note that three erasures of all data symbols can be corrected. For example:

First compute D2=P1−P0

Then D0=P2−D2 and D1=P0−D0

For the case where B=2 we have a codeword sequence of D0C0, D1C1, D2C0, D3C1, D4C0, D5C1, P0C0, P0C1, P1C0, P1C1, P2C0 and P2C1. Where C0 and C1 identify the respective block codewords, the source symbols are D0C0, D1C1, D2C0, D3C1, D4C0, D5C1 and the interleaved parity codewords are P0C0, P0C1, P1C0, P1C1, P2C0, P2C1. For this case:

P2C0=D4C0+D0C0, P1C0=D4C0+D2C0+D0C0 and P0C0=D2C0+D0C0

P2C1=D5C1+D1C1, P1C1=D5C1+D3C1+D1C1 and P0C1=D3C1+D1C1

It can be seen that a burst error impacting any two adjacent sequential symbols will result in only one error in any block codeword and both errors can be corrected. For example if D3C1' and D4C0' are in error then:

P1C1' and P0C1' will not match and D3C1=P0C1−D1C1' is corrected

P2C0' and P1C0' will not match and D4C0=P2C0−D0C0' is corrected

For the binary case corrections simply require inversion of the erroneous bits. For erasures the missing source symbols are computed from the known source symbols and parity symbols.

These examples have been given for illustrative purposes only. The well known block codes, such as the Hamming, BCH, and RS codes, are recommended. The structure of their encoders and decoders is well known in the art. As an example, computer code that implements Reed-Solomon error correction encoding and decoding functions is presented in U.S. Pat. No. 5,602,382 titled "Mail Piece Bar Code Having A Data Content Identifier," which is incorporated herein by reference.

Distributed Register Block Decoder (DRBD)

Figure 7:
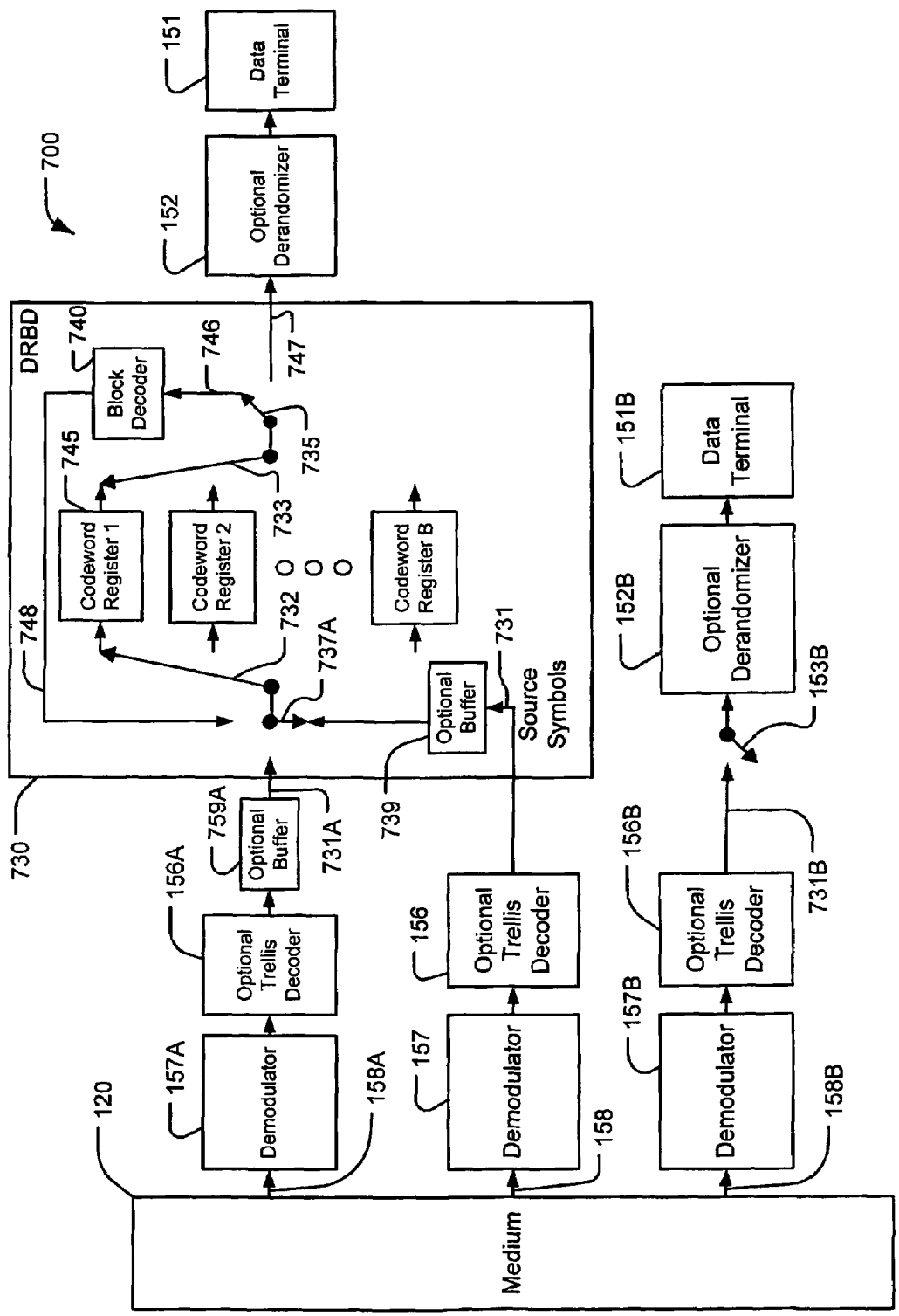
FIG. 7 is a block diagram of an example implementation of (a) a distributed register block decoder (DRBD) in accordance with the present invention that uses registers associated with a single block decoder and that can decode the interleaved parity codewords produced by the DBE of FIG. 4 or the DRBE of FIG. 6 and (b) a data communication system in accordance with the present invention wherein a first receiver without a DRBD receives the data stream from the medium and identifies the source data and a second receiver with the DRBD receives the data stream from the medium and identifies the source data with the DRBD.

FIG. 7 is a block diagram illustrating an example implementation of a distributed register block decoder (DRBD) 730 and further illustrating the concept of utilizing a plurality of receivers 700 with differing FEC capabilities. The receivers 700 receive broadcast data from a DBE 400 (FIG. 4) or a DRBE 600 (FIG. 6) via signal path 158 from medium 120. One receiver has a distributed register block decoder (DRBD) 730. Beneficially, a receiver 700 that does not include a DRBD 730 can receive the source symbols directly.

First Example Implementation

In a first example implementation, the remote DBE 400 or DRBE 600 is designed to transmit original source symbols alternating with interleaved parity codewords.

In the receiver without a DRBD 730, a signal from medium 120 is routed via signal path 158B to demodulator 157B, then optional trellis decoder 156B. The output of optional trellis decoder 156B on connection 731B contains the original source symbols alternating with interleaved parity codewords with possible errors due to imperfections in the medium 120.

Optional switch 153B can be opened to discard the interleaved parity codewords. The output of optional switch 153B contains only the original source symbols in their original sequential order. If the remote DBE 400 utilized an optional randomizer 102, then optional derandomizer 152B is used to derandomize the source symbols. The optional derandomizer 152B delivers recovered source symbols to data terminal 151B with the possible inclusion of symbol errors due to imperfect medium 120.

In the receiver 700 with a DRBD 730, the receiver 700 receives the signal from medium 120 on signal path 158. The signal from medium 120 is routed via signal path 158 to demodulator 157 then to optional trellis decoder 156. The output of optional trellis decoder 156 on connection 731 contains the original source symbols with possible errors due to imperfections in the medium. In this first example, the signal on connection 731 contains groups of original source symbols alternating with groups of interleaved parity codewords. Optional buffer 739 is not required. The symbols on connection 731 are routed via switch 737A directly to distributed register switch 732. A plurality of codeword registers 745 are associated with the single block decoder 740, but preferably reside within the single block decoder 740, as shown in FIG. 7. Switch 732 will distribute symbols to each of the codeword registers 745 in sequential order. Switch 732 routes the first source symbol to codeword register 1 and the next to codeword register 2. This process repeats until B source symbols have been distributed to all codeword registers 745, then continues again with a source symbol to codeword register 1. After k*B source symbols in a block have been received, the interleaved parity codewords are received on connection 731 as input to distributed register switch 732. The distributed register switch 732 continues to distribute all of the parity symbols in the interleaved parity codewords to the codeword registers 745. After p*B parity symbols in a block have been received, the B distributed codeword registers 745 contain complete n-symbol codewords.

Distributed register switch 733 selects the codewords from each codeword register 745 for decoding by block decoder 740. The codeword symbols from codeword register 1 are routed by distributed register switch 733 to switch 735 and from switch 735 to connection 746 for input to block decoder 740. Block decoder 740 corrects any errors in a block up to the capacity of the FEC code then outputs the k corrected source symbols on connection 748. While decoding, switch 737A is positioned to route the corrected source symbols on connection 748 through distributed register switch 732 back into the codeword registers 745. After correcting the source symbols in codeword register 1 the distributed register switches 732 and 733 select codeword register 2 and block decoder 740 corrects the source symbols in codeword register 2. This process continues until the source symbols in all B codeword registers have been corrected. Then switch 735 is connected to connection 747 to output the corrected source symbols through optional derandomizer 152 to data terminal 151. Distributed register switch 733 outputs the first corrected source symbol from codeword register 1, the next corrected source symbol from codeword register 2 and continues outputting one corrected symbol from all B codeword registers. This process continues taking one corrected source symbol from each codeword register in sequence until all k*B corrected source symbols have been output. Then switch 737A is positioned to receive the next uncorrected symbols from connection 731 for input to distributed register switch 732 and distribution to the codeword registers 745.

This cycle repeats with switch 732 delivering the next received symbols to the codeword registers 745. In one variation it is possible for new received symbols to be loading into the codeword registers 745 through distributed register switch 732 at the same time as corrected source symbols are being output through distributed register switch 733. In some implementations, it may be beneficial to have double buffers on the codeword registers 745 so that they may continue to receive new received source symbols, while distributed register switch 733 delivers previously received complete codewords to block decoder 740. In such an arrangement the switches 737A and 735 may operate in "double throw" fashion. One set of codeword registers 745 accepts uncorrected symbols from connection 731 for input and outputs corrected source symbols on connection 747 while a second set of codeword registers 745A (not shown) delivers complete received codewords on connection 746 to block decoder 740 and accepts corrected source symbols on connection 748. The functions of each register set 745 and 745A alternate while one functions for input and output, the other functions for error correction. Such buffering mechanisms are very common in software systems and are easily implemented by indirect addressing.

Second Example Implementation

In a second example implementation, the remote DBE 400 or DRBE 600 is designed to transmit the interleaved parity codewords on a second channel, while the source symbols are transmitted on a first channel.

In this case, in connection with the receiver 700 without a DRBD 730, the optional switch 153B is not required. The signal on connection 731B contains only source symbols. The source symbols are processed by optional derandomizer 152B and delivered to data terminal 151B.

In this second example, the receiver 700 with the DRBD 730 can receive the interleaved parity codewords on the second channel via signal connection 158A. Demodulator 157A and optional trellis decoder 156A recover the interleaved parity codewords and deliver them to optional buffer 759A. Optional buffer 759A allows for simultaneous reception of interleaved parity codewords from one block on the second channel, while receiving source symbols from the next block on the first channel. The interleaved parity codewords from optional buffer 759A are delivered on connection 731A to the DRBD 730.

DRBD 730 incorporates B codeword registers 745, where B is two or more. Each codeword register 745 collects and stores a complete received codeword containing n symbols, where n is one or more. Optional buffer 739 receives source symbols on connection 731 for input to switch 737A. The demodulator 157 and optional trellis decoder 156 provide the source symbols to the connection 731. Switch 737A first selects source data symbols from optional buffer 739. Source symbols pass from optional buffer 739 through switch 737A to distributed register switch 732. Switch 732 will distribute symbols to each of the codeword registers 745 in sequential order. Switch 732 routes the first source symbol to codeword register 1 and the next to codeword register 2. This process repeats until B source symbols have been distributed to all codeword registers 745, then continuing again with a source symbol to codeword register 1. After k*B source symbols in a block have been received from optional buffer 739, then each codeword register will contain the k source symbols of their respective codeword. Then switch 737A selects interleaved parity codewords from connection 731A as input to distributed register switch 732. After all p*B parity symbols in a block have been received from the interleaved parity codewords, the B codeword registers 745 contain complete codewords.

Distributed register switch 733 selects the codewords from each codeword register 745 for decoding by block decoder 740 as described above. This cycle repeats with switch 737A, alternately delivering source symbols and interleaved parity codewords for each block.

Dual Register Set DRBD

Figure 8:
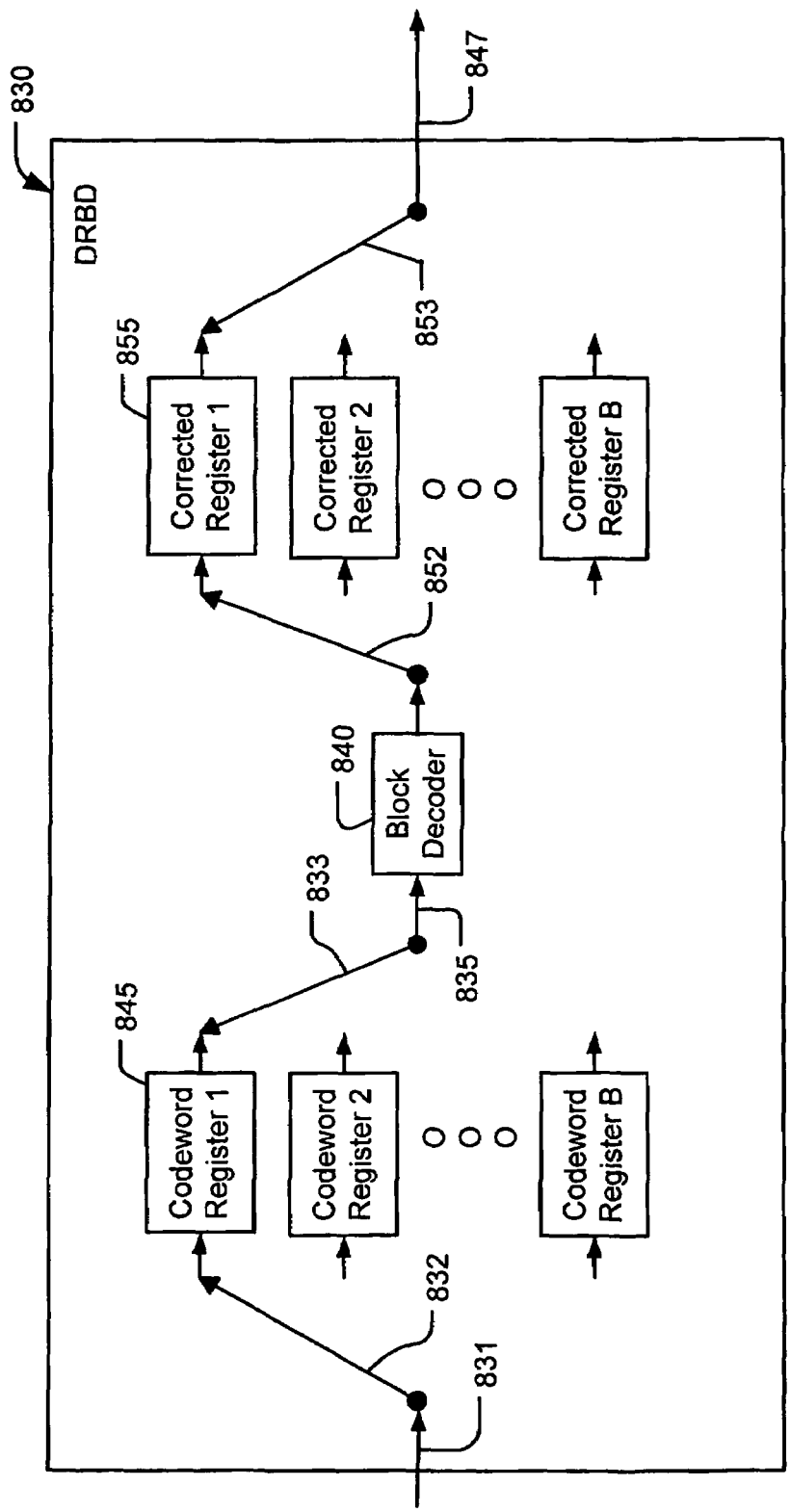
FIG. 8 is a block diagram of another example implementation of a DRBD, which uses a dual set of registers.

An alternative dual register set DRBD 830 uses a set of codeword registers 845 and a set of corrected registers 855 as shown in FIG. 8. In this example, the signal on connection 831 contains groups of original source symbols alternating with groups of interleaved parity codewords. The symbols on connection 831 are routed directly to distributed register switch 832. A plurality of codeword registers 845 are associated with the single block decoder 840, but preferably reside within the single block decoder 840, as shown in FIG. 8. Switch 832 will distribute symbols to each of the codeword registers 845 in sequential order. Switch 832 routes the first source symbol to codeword register 1 and the next to codeword register 2. This process repeats until B source symbols have been distributed to all codeword registers 845, and then continues again with a source symbol to codeword register 1.

After k*B source symbols in a block have been received, the interleaved parity codewords are received on connection 831 as input to distributed register switch 832. The distributed register switch 832 continues to distribute all of the interleaved parity codewords to the codeword registers 845. After p*B parity symbols in a block have been received from the interleaved parity codewords, the B distributed codeword registers 845 each contain complete n-symbol codewords.

Distributed register switch 833 selects the codewords from each codeword register 845 for decoding by block decoder 840. The codeword symbols from codeword register 1 are routed by distributed register switch 833 on connection 835 to block decoder 840. Block decoder 840 corrects any errors in a block up to the capacity of the FEC code, then outputs the k corrected source symbols to distributed register switch 852. Distributed register switch 852 distributes the corrected source symbols to corrected registers 855. All k corrected source symbols from codeword register 1 are routed to corrected register 1. After correcting the source symbols in codeword register 1 the distributed register switches 833 and 852 select codeword register 2, and block decoder 840 corrects the source symbols in codeword register 2 and stores the corrected source symbols in corrected register 2. This process continues until the source symbols in all B codeword registers 845 have been corrected and stored in all B corrected registers 855. Then, distributed register switch 853 outputs the first corrected source symbol from corrected register 1, the next corrected source symbol from corrected register 2 and continues outputting one corrected symbol from all B corrected registers. This process continues taking one corrected source symbol from each codeword register in sequence until all k*B corrected source symbols have been output over connection 847. While outputting corrected source symbols, new uncorrected symbols can be collected from connection 831 and distributed by distributed switch 832 to the codeword registers 845 repeating the cycle.

Distributed Parity Backup

The DBC can be used to construct backup packets of parity symbols or interleaved parity codewords. The backup parity packets can be processed independently. The DBC can monitor source data flow and construct redundant parity files or parity packets. The DBC operates to protect parity packets and their source data from burst errors, while conveniently isolating the source data from the parity packets. These parity packets can be stored for backup restoration or transmitted on independent channels as a service for applications that require low error rates. This allows source data to be stored or communicated without redundancy to increase the efficiency of storage systems or communications channels. Very powerful codes can be used to construct the backup parity packets. Common FEC systems use codes that may compromise correction capability by using a minimum of redundant parity information to increase efficiency.

The backup packets can be offered as a higher cost option in storage or communications systems. The generation of DBE parity packets requires relatively low complexity in the encoder. The decoder may require a significant increase in complexity that may be justified in some applications, but not others. Users that require low error rates can implement the complex decoders and access the backup parity packets.

In communications systems, the backup packets can be communicated over an independent channel. The channel can be isolated through normal means of frequency band, time slot, or code. Common channelization methods include frequency division multiplexing (FDM), time division multiplexing (TDM), code division multiple access (CDMA) and others.

A variation in the ARQ system would allow a backup parity packet or block to be sent as a reply instead of the normal retransmission of entire blocks. If the parity packet is sufficient to correct a block error, then communication resumes with minimal disruption. If the parity packet is not sufficient to correct an erroneous block then the entire block can be retransmitted.

Independent parity packets will enable adaptive FEC. In low error environments, the parity packets are not required. As the error rate environment increases, then the parity packets can be used.

In data storage systems, source data files can be stored as normal media data files. Then backup parity packets or files can be generated and stored as independent files. Systems accessing the storage medium can simply access the raw source data files whenever needed. The backup parity files can be ignored, unless an error is detected. If a file is retrieved and found to be in error, then the backup parity file can be used to recover the original source data from the corrupted source data file. One advantage of RS type codes is that p parity symbols can correct p/2 errors or p erasures. Files that are detected to be in error can be flagged as erasures thereby doubling the recovery capability of the code. Errors can be detected in files or packets by simple cyclic redundancy check (CRC) codes.

For archive systems, the source files can be periodically scanned to detect any degradation. If errors are found, then the corrupted files can be restored using the parity files. In a system that may slowly degrade, the DFEC codes will be sufficient to correct all errors if detected early before the number of errors exceeds the capacity of the code. The burst error protection of DBC is beneficial where areas of media may degrade contiguous segments of both source data and parity information. The use of complex error correction algorithms can be justified when applied to only files or packets that are known to be corrupted. Complex algorithms can seldom be justified if it is necessary to apply them to all data when only a small amount of data may be in error.

One example applies to computer disks, such as magnetic disks, compact disks (CDs), and DVD disks. In many applications, media elements contain a specific set of data, such as files from a particular project or entertainment programs.

Frequently the media is not full. It would be beneficial to store backup parity packets or files in the media to make use of any spare capacity.

The DFEC system is particularly well suited to systems that transmit or store groups of packets or files. The transmission can be terminated without the addition of excess overhead to purge interleavers or fill unreasonably large codewords. Consider a largest packet containing L symbols. It is recommended that the DFEC system use B greater than or equal to L to enable restoration of a packet that may be completely obliterated. It may be sufficient to use B greater than or equal to L*2/p if the code can correct p/2 symbol errors. A complete DFEC block normally contains n*B symbols consisting of k*B source data symbols and p*B parity symbols. An abbreviated transmission can be terminated after sending k2*B+k1 source data symbols where k2*B+k1 is less than the designed DFEC block size of k*B source data symbols. After the last source symbol is sent the DBE can be filled with predetermined fill symbols such as zeros that are not transmitted. The DFEC then transmits all p*B parity symbols to complete the DFEC block.

There are two preferred methods of sending the final parity symbols, while maintaining the B symbol burst protection. The parity symbols can be transmitted out of order starting with P(k1), P(k1+1) ... through P(p−1) then P0, P1, P2 ... through P(k1−1). A second preferred method is to fill out the last codewords by transmitting p−k1 fill symbols then the parity symbols commencing with P0, P1, P2 ... P(p−1). It is not recommended to transmit the first parity symbol P0 immediately following an abbreviated frame of k2*B+k1 source symbols because this would leave only k1 symbols between the last source symbol of codeword 0 and its first parity symbol P0 thereby reducing the burst error protection to only k1 symbols. The parity symbols can be stored or transmitted in an independent packet but it is best to maintain the B symbol separation between codeword symbols spread across two or more packets.

Software and Hardware Implementations

The transmitter and receiver elements, including but not limited to, the DBE 430, the DBD 530, the DRBE 600, and the DRBD 730, can be implemented in hardware, software, or a combination thereof. In the preferred embodiment(s), these elements are implemented in software or firmware that is stored in a memory and that is executed by a suitable instruction execution system, such as a digital signal processor (DSP) or general purpose microprocessor. Moreover, connections and switches in the figures represent logical connectivity.

If implemented in hardware, as in an alternative embodiment, these elements can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), a quantum computer having quantum gates for implementing manipulations on qubits, etc.

When the foregoing elements are implemented in software, they can be stored on any suitable computer readable medium. In the context of this document, a "computer-readable medium" can be any means that can contain, store, communicate, propagate, or transport the program for use by or in connection with an instruction execution system, processor, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical).

Variations and Modifications

In concluding the detailed description, it should be noted that the terminology "preferred embodiment" herein means the one embodiment currently believed by the inventor(s) to be the best embodiment of a plurality of possible embodiments. Moreover, it will be obvious to those skilled in the art that many variations and modifications may be made to the preferred embodiment(s) without substantially departing from the principles of the present invention. All such variations and modifications are intended to be included herein within the teachings of the present invention in this document.

At least the following inventions are claimed:

1. An encoding method, comprising:
   providing an input stream of source data symbols;
   encoding the source data symbols with a plurality of block encoders, respectively, to produce interleaved parity codewords, the interleaved parity codewords for enabling decoding of error-corrected source data symbols;
   producing an output stream by alternating blocks of the source data symbols and blocks of the interleaved parity codewords; and
   transmitting the source data symbols and the interleaved parity codewords alternately in separate packets where sequential packets have source data symbols and interleaved parity codewords respectively that correspond with each other.

2. An encoding method, comprising:
   providing an input stream of source data symbols;
   encoding the source data symbols with a plurality of block encoders, respectively, to produce interleaved parity codewords, the interleaved parity codewords for enabling decoding of error-corrected source data symbols;
   producing an output stream by alternating blocks of the source data symbols and blocks of the interleaved parity codewords; and
   transmitting the source data symbols and the interleaved parity codewords in a single packet where the source data symbols correspond to the interleaved parity codewords in the single packet.

3. An encoding method, comprising:
   providing an input stream of source data symbols;
   encoding the source data symbols with a plurality of block encoders, respectively, to produce interleaved parity codewords, the interleaved parity codewords for enabling decoding of error-corrected source data symbols;
   producing an output stream by alternating blocks of the source data symbols and blocks of the interleaved parity codewords, wherein the output stream contains k*B source data symbols and p*B interleaved parity codewords, where k and p are equal and B is equal to the number of block encoders.

4. An encoding method, comprising:
providing an input stream of source data symbols;
encoding the source data symbols with a plurality of block encoders, respectively, to produce interleaved parity codewords, the interleaved parity codewords for enabling decoding of error-corrected source data symbols;
producing an output stream by alternating blocks of the source data symbols and blocks of the interleaved parity codewords, and wherein the output stream contains k*B source data symbols and p*B interleaved parity codewords, where k and p are unequal and B is equal to the number of block encoders.

5. The method of claim 4, further comprising the step of modulating and transmitting the output stream through a propagation medium.

6. The method of claim 5, further comprising the step of trellis encoding the output stream prior to modulating and transmitting the output stream.

7. The method of claim 4, further comprising the step of storing the output stream in a storage medium.

8. The method of claim 7, wherein the source data symbols include a cyclic redundancy check (CRC) code word to enable detection of error free source data symbols.

9. The method of claim 4, wherein the block encoders include different types.

10. The method of claim 4, wherein the block encoders include at least some of the same type.

11. The method of claim 4, wherein each of the source data symbols is one or more bits.

12. The method of claim 4, wherein at least one of the block encoders implements a Hamming code.

13. The method of claim 4, wherein at least one of the block encoders implements a BCH code.

14. The method of claim 4, wherein at least one of the block encoders implements a Reed-Solomon code.

15. The method of claim 4, further comprising the step of randomizing the source data symbols prior to the encoding step.

16. The method of claim 4, wherein the input stream of source data symbols is a single bit stream of sequential source data symbols.

17. The method of claim 4, wherein the source data symbols include a cyclic redundancy check (CRC) code word to enable detection of error free source data symbols.

18. The method of claim 4, further comprising the steps of transmitting the output stream to a receiver and then retransmitting a block of the source data symbols or a block of the interleaved parity codewords in response to a request from the receiver.

19. The method of claim 4, further comprising performing the steps with computer software residing on a non-transitory computer readable medium.

20. The method of claim 4, wherein the source data symbols of the output stream are in a non-interleaved sequential order as in the input stream.

21. An encoding method, comprising:
providing an input stream of source data symbols;
encoding the source data symbols with a plurality of block encoders, respectively, to produce interleaved parity codewords, the interleaved parity codewords for enabling decoding of error-corrected source data symbols;
producing an output stream by alternating blocks of the source data symbols and blocks of the interleaved parity codewords, wherein the output stream contains k*B source data symbols and p*B interleaved parity codewords, where k and p are unequal and B is equal to the number of block encoders; and
wherein the output stream is produced in packets of L symbols, where L is less than k*B.

22. An encoding method, comprising:
providing an input stream of source data symbols;
encoding the source data symbols with a plurality of block encoders, respectively, to produce interleaved parity codewords, the interleaved parity codewords for enabling decoding of error-corrected source data symbols;
producing an output stream by alternating blocks of the source data symbols and blocks of the interleaved parity codewords, wherein the output stream contains k*B source data symbols and p*B interleaved parity codewords, where k and p are unequal and B is equal to the number of block encoders; and
wherein the output stream is produced in packets of L symbols, where L is less than or equal to B.

23. An encoding method, comprising:
providing an input stream of source data symbols;
encoding the source data symbols with a plurality of block encoders, respectively, to produce interleaved parity codewords, the interleaved parity codewords for enabling decoding of error-corrected source data symbols;
producing an output stream by alternating blocks of the source data symbols and blocks of the interleaved parity codewords; and
wherein the block encoders are implemented in a single block encoder by:
associating a plurality of registers with the single block encoder;
producing the interleaved parity codewords by:
performing logical operations upon the source data symbols to produce combinations; and
accumulating the combinations with the registers.

24. An encoding system, comprising:
means for providing an input stream of source data symbols;
means for encoding the source data symbols with a plurality of block encoders, respectively, to produce interleaved parity codewords, the interleaved parity codewords for enabling decoding of error-corrected source data symbols;
means for producing an output stream by alternating blocks of the source data symbols and blocks of the interleaved parity codewords, and wherein the output stream contains k*B source data symbols and p*B interleaved parity codewords, where k and p are unequal and B is equal to the number of block encoders.

25. The system of claim 24, further comprising means for modulating and transmitting the output stream through a propagation medium.

26. The system of claim 25, further comprising means for trellis encoding the output stream prior to modulating and means for transmitting the output stream.

27. The system of claim 24, further comprising means for storing the output stream in a storage medium.

28. The system of claim 27, wherein the source data symbols include a cyclic redundancy check (CRC) code word to enable detection of error free source data symbols.

29. The system of claim 24, wherein the block encoders include different types.

30. The system of claim 24, wherein the block encoders include at least some of the same type.

31. The system of claim 24, wherein each of the source data symbols is one or more bits.

32. The system of claim 24, wherein at least one of the block encoders implements a Hamming code.

33. The system of claim 24, wherein at least one of the block encoders implements a BCH code.

34. The system of claim 24, wherein at least one of the block encoders implements a Reed-Solomon code.

35. The system of claim 24, further comprising means for randomizing the source data symbols prior to the encoding by the encoding means.

36. The system of claim 24, wherein the input stream of source data symbols is a single bit stream of sequential source data symbols.

37. The system of claim 24, wherein the source data symbols include a cyclic redundancy check (CRC) code word to enable detection of error free source data symbols.

38. The system of claim 24, further comprising means for transmitting the output stream to a receiver and means for retransmitting the source data symbols or the interleaved parity codewords to the receiver in response to a request from the receiver.

39. The system of claim 24, embodied in computer software residing on a non-transitory computer readable medium.

40. The system of claim 24, wherein the source data symbols of the output stream are in the original non-interleaved sequential order as in the input stream.

41. An encoding system, comprising:
means for providing an input stream of source data symbols;
means for encoding the source data symbols with a plurality of block encoders, respectively, to produce interleaved parity codewords, the interleaved parity codewords for enabling decoding of error-corrected source data symbols;
means for producing an output stream by alternating blocks of the source data symbols and blocks of the interleaved parity codewords; and
means for transmitting the source data symbols and the interleaved parity codewords alternately in separate packets where sequential packets have source data symbols and interleaved parity codewords respectively that correspond with each other.

42. An encoding system, comprising:
means for providing an input stream of source data symbols;
means for encoding the source data symbols with a plurality of block encoders, respectively, to produce interleaved parity codewords, the interleaved parity codewords for enabling decoding of error-corrected source data symbols;
    means for producing an output stream by alternating blocks of the source data symbols and blocks of the interleaved parity codewords; and
    means for transmitting the source data symbols and the interleaved parity codewords in a single packet where the source data symbols correspond to the interleaved parity codewords in the single packet.

43. An encoding system, comprising:
means for providing an input stream of source data symbols;
means for encoding the source data symbols with a plurality of block encoders, respectively, to produce interleaved parity codewords, the interleaved parity codewords for enabling decoding of error-corrected source data symbols;
means for producing an output stream by alternating blocks of the source data symbols and blocks of the interleaved parity codewords, wherein the output stream contains k*B source data symbols and p*B interleaved parity codewords, where k and p are unequal and B is equal to the number of block encoders; and
wherein the output stream is produced in packets of L symbols, where L is less than k*B.

44. An encoding system, comprising:
means for providing an input stream of source data symbols;
means for encoding the source data symbols with a plurality of block encoders, respectively, to produce interleaved parity codewords, the interleaved parity codewords for enabling decoding of error-corrected source data symbols;
means for producing an output stream by alternating blocks of the source data symbols and blocks of the interleaved parity codewords, wherein the output stream contains k*B source data symbols and p*B interleaved parity codewords, where k and p are unequal and B is equal to the number of block encoders; and
wherein the output stream is produced in packets of L symbols, where L is less than or equal to B.

45. An encoding system, comprising:
means for providing an input stream of source data symbols;
means for encoding the source data symbols with a plurality of block encoders, respectively, to produce interleaved parity codewords, the interleaved parity codewords for enabling decoding of error-corrected source data symbols;
    means for producing an output stream by alternating blocks of the source data symbols and blocks of the interleaved parity codewords, and wherein the block encoders are implemented in a single block encoder by:
means for associating a plurality of registers with the single block encoder;
means for producing the interleaved parity codewords by:
    means for performing logical operations upon the source data symbols to produce combinations; and
    means for accumulating the combinations with the registers.

* * * * *